(12) United States Patent
Kaneda et al.

(10) Patent No.: US 7,020,961 B2
(45) Date of Patent: Apr. 4, 2006

(54) METHOD FOR MANUFACTURING A BUMP-ATTACHED WIRING CIRCUIT BOARD

(75) Inventors: Yutaka Kaneda, Kanuma (JP); Keiichi Naito, Kanuma (JP); Soichiro Kishimoto, Kanuma (JP); Toshihiro Shinohara, Kanuma (JP)

(73) Assignee: Sony Corporation, Tokyo (JP)

( * ) Notice: Subject to any disclaimer, the term of this patent is extended or adjusted under 35 U.S.C. 154(b) by 217 days.

(21) Appl. No.: 10/268,722

(22) Filed: Oct. 11, 2002

(65) Prior Publication Data

US 2003/0034173 A1   Feb. 20, 2003

Related U.S. Application Data

(62) Division of application No. 09/895,210, filed on Jul. 2, 2001, now Pat. No. 6,518,510.

(30) Foreign Application Priority Data

Jul. 11, 2000   (JP)   ............................. 2000-210482

(51) Int. Cl.
*H01K 3/10* (2006.01)

(52) U.S. Cl. .................. 29/852; 29/846; 174/254; 174/256; 427/97; 427/99

(58) Field of Classification Search .................. 29/846, 29/852; 216/13, 20; 174/250, 254, 256
See application file for complete search history.

(56) References Cited

U.S. PATENT DOCUMENTS

| 4,528,064 A | 7/1985 | Ohsawa et al. |
| 4,774,127 A | 9/1988 | Reagan et al. |
| 4,908,940 A | 3/1990 | Amano et al. |
| 4,931,144 A | 6/1990 | Brighton |
| 5,252,988 A * | 10/1993 | Katayama et al. .......... 347/205 |
| 5,260,518 A | 11/1993 | Tanaka et al. |
| 5,329,423 A | 7/1994 | Scholz |
| 6,181,569 B1 | 1/2001 | Chakravorty |
| 6,562,250 B1 * | 5/2003 | Kaneda et al. ................. 216/13 |
| 6,568,073 B1 * | 5/2003 | Fukutomi et al. ............. 29/846 |

FOREIGN PATENT DOCUMENTS

| JP | B-57-18357 | 4/1982 |
| JP | A-05-183266 | 7/1993 |
| JP | A-10-256736 | 9/1998 |

(Continued)

*Primary Examiner*—Richard Chang
(74) *Attorney, Agent, or Firm*—Oliff & Berridge, PLC

(57) ABSTRACT

An object of the present invention is to manufacture a bump-attached wiring circuit board with which stable bump connections are possible, and there is no need for bothersome operations such as plating pretreatments. A bump formation etching mask (7) is formed on the bump formation side (3a) of a metal foil (3) having a thickness (t1+t2) equal to the sum of the thickness t1 of a wiring circuit (1) and the height t2 of the bumps (2) to be formed on a wiring circuit (1), the bumps (2) are formed by half-etching the metal foil (3) from the bump formation etching mask (7) side down to a depth corresponding to a predetermined bump height t2, and a metal thin film layer (10) composed of a different metal from the metal foil (3) is formed on the bump formation side of the metal foil (3), thereby providing a bump-attached wiring circuit board with which stable bump connections are possible, and there is no need for bothersome operations such as plating pretreatments.

8 Claims, 3 Drawing Sheets

FOREIGN PATENT DOCUMENTS

| | | |
|---|---|---|
| JP | A-11-054568 | 2/1999 |
| JP | 2000-082761 | 3/2000 |
| JP | A-2000-082761 | 3/2000 |
| JP | 2000-165037 | 6/2000 |

* cited by examiner

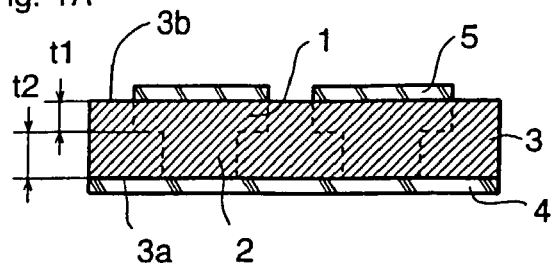
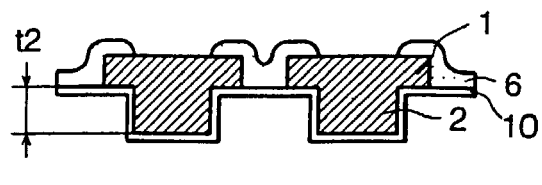
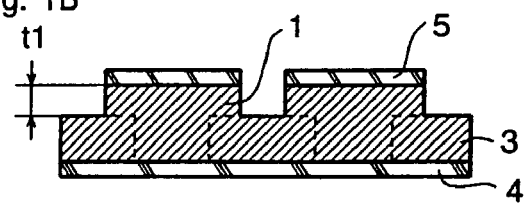
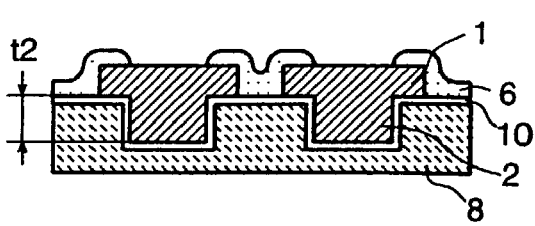
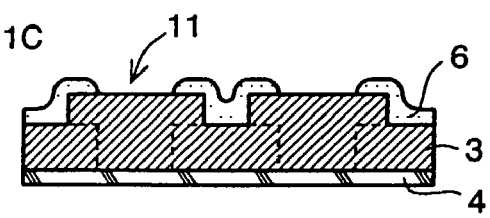
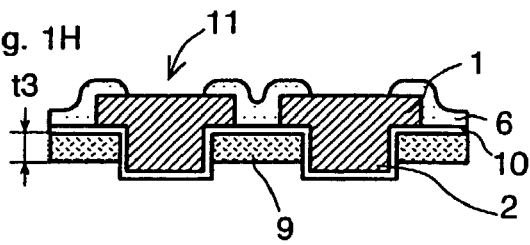
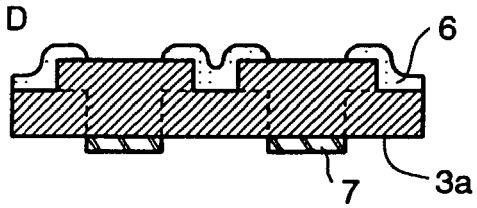
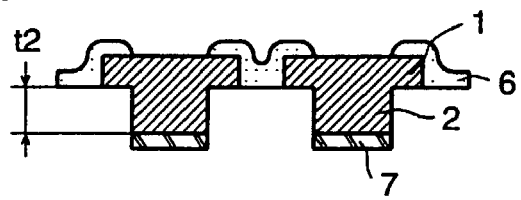

33
31
32

31
34

35
34

36
31
35
34

37
34

METHOD FOR MANUFACTURING A BUMP-ATTACHED WIRING CIRCUIT BOARD

This is a Division Ser. No. 09/895,210 filed Jul. 2, 2001 now U.S. Pat. No. 6,518,510. The entire disclosure of the prior application is hereby incorporated by reference herein in its entirety.

BACKGROUND OF THE INVENTION

1. Field of the Invention

The present invention relates to a bump-attached wiring circuit board having bumps of a uniform height, and to a method for manufacturing this board.

2 Description of the Related Art

It is common practice to make connections with microscopic bumps (such as those with a diameter of 50 μm and a height of 30 μm) when connecting a wiring circuit board and electronic elements such as semiconductor elements or liquid crystal display elements, or when connecting layers in a multilayer wiring board.

FIGS. 3A to 3E illustrate a typical method for forming bumps of this size.

First, as shown in FIG. 3A, a two-layer flexible board 33 is prepared by affixing a copper foil 32 to a polyimide film 31, and the copper foil 32 is patterned by photolithography to form a wiring circuit 34 (FIG. 3B).

Next, a cover coat layer 35 is formed by a conventional method on the wiring circuit 34 (FIG. 3C). For instance, a polyamic acid layer may be formed on the wiring circuit 34 and patterned by photolithography, and a cover coat layer 35 formed by imidation. Alternatively, a resist ink may be applied by printing.

Next, bump holes 36 are formed by irradiation with laser light in the region of the polyimide film 31 corresponding to the wiring circuit 34 (FIG. 3D), and then the cover coat layer 35 is covered with a protective film (not shown) as needed, after which microscopic bumps are formed by growing metal bumps 37 over the wiring circuit 34 exposed at the bottom of the bump holes 36 (FIG. 3E).

However, when the bump holes 36 are made by irradiation with laser light, there is variance in their open surface area due to variance in the smear amount clinging to the bottom of the bump holes 36, and this results in the problem of considerable variance occurring in the height of the metal bumps 37. This makes it difficult to achieve stable bump connection. It is particularly difficult to connect semiconductor elements all at once to a wiring circuit by ultrasonic connection. A plating pretreatment is also essential in order to improve the adhesive strength between the wiring circuit 34 and the metal bumps 37 formed on it.

SUMMARY OF THE INVENTION

The present invention attempts to solve the above-mentioned problems encountered with prior art, and it is an object thereof to provide a method for manufacturing a bump-attached wiring circuit board with which stable bump connection is possible, and there is no need for bothersome operations such as plating pretreatment.

The inventors arrived at the present invention upon discovering that bumps of a uniform height can be produced, without performing bothersome operations such as plating pretreatment, by half-etching a metal foil, whose thickness is equal to the sum of the thickness of the wiring circuit layer and a thickness corresponding to the metal bump height, down to a depth corresponding to the metal bump height, and that if a metal thin film layer composed of a different metal from the metal foil is formed on the bump formation side of the metal foil, then adhesion will be improved between the bump formation side of the metal foil and the insulating layer above, the chemical resistance of the wiring circuit board will be improved, separation between the metal foil on the bump side and the insulating layer above will be prevented, and stable bump connection can be achieved.

Specifically, the present invention is a bump-attached wiring circuit board in which a cover coat layer is formed on one side of a wiring circuit, an insulating layer is formed on the other side, and bumps that are electrically connected to the wiring circuit are formed protruding from the insulating layer, wherein the wiring circuit and the bumps are integrally formed from a single metal foil, and a metal thin film layer composed of a different metal from said metal foil is provided between the insulating layer and the side of the wiring circuit on which the bumps are formed.

Here, when the insulating layer is a polyimide film produced by the imidation of a polyimide precursor layer, it is preferable if the metal thin film layer exhibits higher adhesive force with respect to the polyimide precursor layer than to the metal foil. Favorable examples of combinations of the metal foil and metal thin film here include a metal foil that is copper foil, combined with a metal thin film of nickel, zinc, tin, or a nickel-cobalt alloy. In this bump-attached wiring circuit board, it is preferable for the cover coat layer to have a connection opening for allowing access to the wiring circuit from the cover coat side.

The present invention is also a method for manufacturing a bump-attached wiring circuit board in which bumps are formed on a wiring circuit, comprising the steps of:

(a) laminating a protective film over the bump formation side of a metal foil having a thickness equal to the sum of the thickness of the wiring circuit and the height of the bumps to be formed on the wiring circuit, and forming a wiring circuit formation etching mask on the wiring circuit formation side of the metal foil;

(b) forming a wiring circuit in a predetermined thickness by half-etching the metal foil from the side with the wiring circuit formation etching mask;

(c) removing the wiring circuit formation etching mask, and then providing a cover coat layer to the wiring circuit;

(d) removing the protective film provided to the bump formation side of the metal foil, and then forming a bump formation etching mask on this bump formation side;

(e) forming bumps of a predetermined height by half-etching the metal foil from the bump formation etching mask side;

(f) removing the bump formation etching mask, and then forming a metal thin film layer composed of a different metal from that of the metal foil;

(g) forming a polyimide precursor layer over the metal thin film layer so as to bury the bumps; and (h) etching back the polyimide precursor layer and forming an insulating layer in a predetermined thickness by imidation.

With this manufacturing method, the wiring circuit is formed before the bumps are formed.

Further, the present invention is a method for manufacturing a bump-attached wiring circuit board in which bumps are formed on a wiring circuit, comprising the steps of:

(aa) laminating a protective film over the wiring circuit formation side of a metal foil having a thickness equal to the sum of the thickness of the wiring circuit and the height of the bumps to be formed on the wiring circuit, and forming a bump formation etching mask on the bump formation side of the metal foil;

(bb) forming bumps of a predetermined height by half-etching the metal foil from the side with the bump formation etching mask;

(cc) removing the bump formation etching mask, and then forming a metal thin film layer composed of a different metal from that of the metal foil;

(dd) forming a polyimide precursor layer over the metal thin film layer so as to bury the bumps;

(ee) etching the polyimide precursor layer and forming an insulating layer in a predetermined thickness by imidation;

(ff) removing the protective film provided to the wiring circuit formation side of the metal foil, and then forming a wiring circuit formation etching mask on this wiring circuit formation side;

(gg) forming a wiring circuit in a predetermined thickness by half-etching the metal foil from the wiring circuit formation etching mask side; and (hh) removing the wiring circuit formation etching mask, and then providing a cover coat layer to the wiring circuit.

With this manufacturing method, the bumps are formed before the wiring circuit is formed.

BRIEF DESCRIPTION OF THE DRAWINGS

FIGS. 1A to 1H are diagrams illustrating the steps in the method of the present invention for manufacturing a bump-attached wiring circuit board;

DESCRIPTION OF THE PREFERRED EMBODIMENTS

Figure 2A:
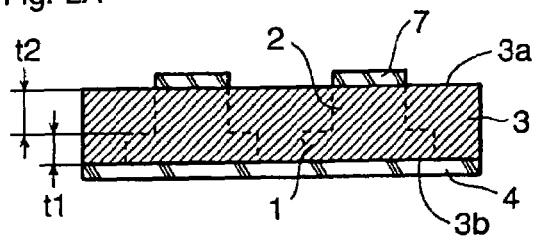
FIGS. 2A to 2I are diagrams illustrating the steps in the method of the present invention for manufacturing a bump-attached wiring circuit board.

The various steps in the manufacture of the bump-attached wiring circuit board of the present invention will now be described in detail through reference to the drawings.

First, a method for manufacturing a bump-attached wiring circuit board in which bumps are formed on a wiring circuit, and in which the wiring circuit is formed before the bumps are formed (steps (a) to (h)), will be described step by step through reference to FIGS. 1A to 1H.

Step (a)

First, a protective film 4 is laminated on the bump formation side 3a of a metal foil 3 having a thickness equal to the sum of the thickness t1 of a wiring circuit 1 (see dotted line in figure) and the height t2 of the bumps 2 (see dotted line in figure) to be formed on the wiring circuit 1, and a wiring circuit etching mask 5 is formed on the wiring circuit formation side 3b of the metal foil 3 (FIG. 1A).

The optimal values are selected for the thickness t1 of the wiring circuit and the height t2 of the bumps 2 according to the intended use of the wiring circuit board. For example, if the wiring circuit board is to be used as a mounting board for semiconductor elements, then the thickness t1 of the wiring circuit can be set at 20 μm, the height t2 of the bumps 2 at 30 μm, and the diameter of the bumps 2 at 50 μm.

Any material used in the conductor layer of a wiring circuit board can be used as the metal foil 3, but the use of a copper foil is preferred.

The wiring circuit etching mask 5 can be formed by the screen printing of a resist ink on the wiring circuit formation side 3b of the metal foil 3. Alternatively, a photosensitive resin layer or a dry film can be provided and patterned by exposure and developing according to conventional methods.

Step (b)

Next, the metal foil 3 is half-etched from the wiring circuit etching mask 5 side to form the wiring circuit 1 in the conventional thickness t1 (FIG. 1B).

The half-etching conditions (such as temperature and etching liquid composition) can be suitably selected according to the material of the metal foil 3, the thickness to be etched, and so forth.

Step (c)

The wiring circuit etching mask 5 is then removed by a conventional method, after which the cover coat layer 6 is provided to the wiring circuit 1 (FIG. 1C).

The cover coat layer 6 can be formed by the screen printing of a coating material for the cover coat layer. Alternatively, a photosensitive resin layer or a dry film can be provided and patterned by exposure and developing according to conventional methods. Also, a layer composed of a polyimide precursor such as polyamic acid can be provided, patterned, and imidated by conventional methods to form the cover coat layer 6.

In providing the cover coat layer 6, it is preferable to provide a connection opening 11 that will allow access to the wiring circuit 1 from the cover coat layer 6 side.

Step (d)

The protective film 4 provided to the bump formation side 3a of the metal foil 3 is removed by a conventional method, after which a bump formation etching mask 7 is formed on the bump formation side 3a (FIG. 1D).

The bump formation etching mask 7 can be formed by the screen printing of a resist ink on the bump formation side 3a. Alternatively, a photosensitive resin layer or a dry film can be provided and patterned by exposure and developing according to conventional methods.

Step (e)

Bumps 2 of a predetermined height t2 are formed by half-etching the metal foil 3 from the bump formation etching mask 7 side (FIG. 1E).

The half-etching conditions (such as temperature and etching liquid composition) can be suitably selected according to the material of the metal foil 3, the thickness to be etched, and so forth.

Prior to this half-etching, the cover coat layer 6 may be covered with a protective film (not shown).

Step (f)

The bump formation etching mask 7 is removed by a conventional method, after which a metal thin film layer 10 composed of a different metal from the metal foil 3 is formed (FIG. 1F).

It is preferable for the metal thin film layer 10 to be formed from a metal material that exhibits high adhesive force with respect to a polyimide precursor layer 8 (discussed below). This will afford better adhesion between the polyimide precursor layer 8 and the metal foil 3, and therefore in subsequent chemical treatment (such as the etch-back of the polyimide precursor layer 8 in step (g)), separation can be prevented between the metal foil 3 and the polyimide precursor layer 8 or an insulating layer 9 (see step (h)) produced by the imidation of this polyimide precursor layer 8.

Favorable examples of this metal thin film layer 10 when the metal foil 3 is an ordinary copper foil include metal thin films of nickel, zinc, tin, and a nickel-cobalt alloy. These thin films can be formed by electroless plating, electrolytic plating, vacuum vapor deposition, or another such method.

If the metal thin film layer 10 is too thin, adhesion cannot be sufficiently improved between the insulating layer 9 and the wiring circuit 1, but if it is too thick, the obtained effect will not correspond to the increased thickness, so a preferable range is 0.01 to 4 µm. In particular, when the metal thin film layer 10 is a thin film of zinc or tin, the preferred thickness of this layer is 0.1 to 0.5 µm; when the metal thin film layer 10 is a thin film of a nickel-cobalt alloy, the preferred thickness of this layer is 0.1 to 4 µm; and when it is a thin film of nickel, the preferred thickness of this layer is 0.01 to 1 µm.

In the removal of the bump formation etching mask 7, if the cover coat layer 6 is covered with a protective film, the protective film may be removed at the same time.

Step (g)

The polyimide precursor layer 8 is formed over the metal thin film layer 10 so as to bury the bumps (FIG. 1G).

The polyimide precursor layer 8 can be formed by a conventional film formation process from polyamic acid or the like. The imidation conditions can also be determined according to the type of polyimide precursor and so forth.

Step (h)

The polyimide precursor layer 8 is etched back and imidated to form the insulating layer 9 in a predetermined thickness t3. This yields the bump-attached wiring circuit board shown in FIG. 1H.

Next, a method for manufacturing a bump-attached wiring circuit board in which bumps are formed on a wiring circuit, and in which the bumps are formed before the wiring circuit is formed (steps (aa) to (hh)), will be described step by step through reference to FIGS. 2A to 2I. The structural elements in FIGS. 2A to 2I correspond to the structural elements numbered the same in FIGS. 1A to 1H.

Step (aa)

First, a protective film 4 is laminated on the wiring circuit formation side 3b of a metal foil 3 having a thickness equal to the sum of the thickness t1 of a wiring circuit 1 (see dotted line in figure) and the height t2 of the bumps 2 (see dotted line in figure) to be formed on the wiring circuit 1, and a bump formation etching mask 7 is formed on the bump formation side 3a of the metal foil 3 (FIG. 2A).

Step (bb)

Figure 2F:
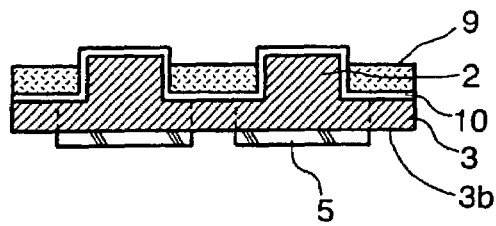
Figure 2B:
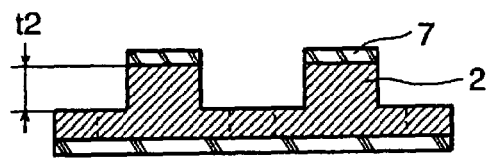

The metal foil 3 is half-etched from the bump formation etching mask 7 side to form the bumps 2 of a predetermined height t2 (FIG. 2B).

Step (cc)

Figure 2G:
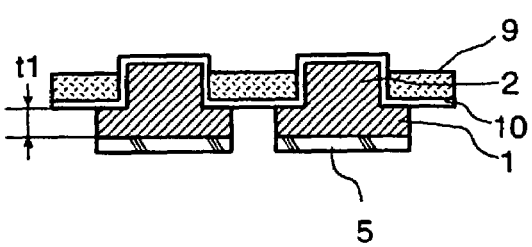
Figure 2C:
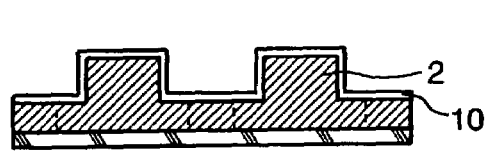
Figure 2H:
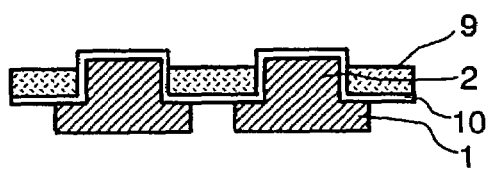

The bump formation etching mask 7 is removed by a conventional method, after which a metal thin film layer 10 composed of a different metal from the metal foil 3 is formed (FIG. 2C).

Step (dd)

Figure 2D:

The polyimide precursor layer 8 is formed over the metal thin film layer 10 so as to bury the bumps 2 (FIG. 2D).

Step (ee)

Figure 2I:
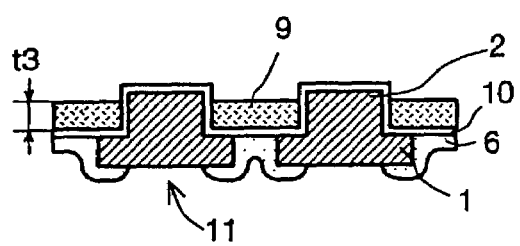
Figure 2E:
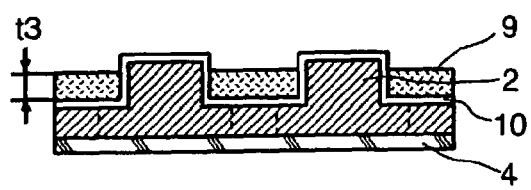
Figure 3A:
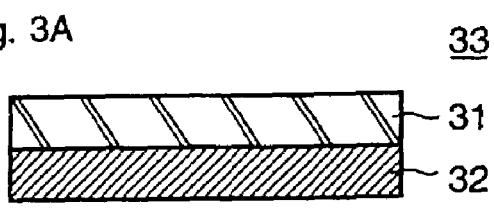
FIGS. 3A to 3E are diagrams illustrating the steps in a conventional method for manufacturing a bump-attached wiring circuit board.
Figure 3B:
Figure 3C:
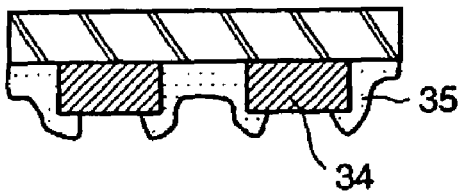
Figure 3D:
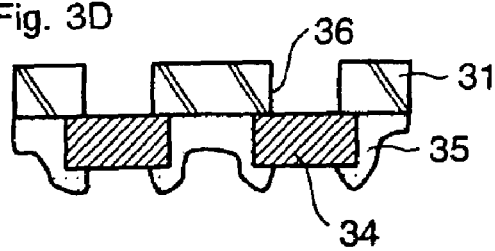
Figure 3E:
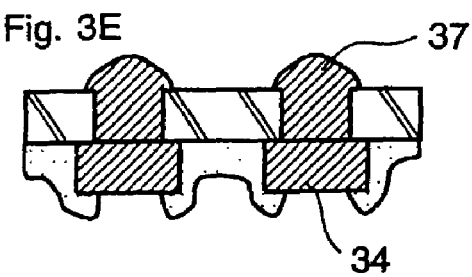

The polyimide precursor layer 8 is etched back and imidated to form the insulating layer 9 in a predetermined thickness t3 (FIG. 2E).

Step (ff)

The protective film 4 provided to the wiring circuit formation side 3b of the metal foil 3 is removed by a predetermined method, after which a wiring circuit etching mask 5 is formed on the wiring circuit formation side 3b (FIG. 2F).

Step (gg)

The metal foil 3 is half-etched from the wiring circuit etching mask 5 side to form the wiring circuit 1 in the predetermined thickness t1 (FIG. 2G).

Prior to this half-etching, the bumps 2 may be covered with a protective film (not shown).

Step (hh)

The wiring circuit etching mask 5 is removed by a predetermined method (FIG. 2H), after which the cover coat layer 6 is provided to the wiring circuit 1. This yields the bump-attached wiring circuit board shown in FIG. 2I. It is preferable here to provide a connection opening 11 that will allow access to the wiring circuit 1 from the cover coat layer 6 side.

In the removal of the wiring circuit etching mask 5, if the bump 2 is covered with a protective film, the protective film may be removed at the same time.

As shown in FIG. 1H and FIG. 2I, the bump-attached wiring circuit board obtained by the above manufacturing method of the present invention is such that the cover coat layer 6 is formed on one side of the wiring circuit 1, the insulating layer 9 is formed on the other side, and the bumps 2, which are electrically connected to the wiring circuit 1, are formed protruding from the insulating layer 9, wherein the wiring circuit 1 and the bumps 2 are integrally formed from a single metal foil, and the metal thin film layer 10 composed of a different metal from said metal foil is provided between the insulating layer 9 and the side of the wiring circuit 1 on which the bumps 2 are formed. When the insulating layer 9 is a polyimide film produced by the imidation of a polyimide precursor layer, this metal thin film layer 10 is preferably formed from a material that exhibits higher adhesive force with respect to the polyimide precursor layer than to the metal foil. For example, when the metal foil is a copper foil, the metal thin film layer 10 is formed from a thin film of nickel, zinc, tin, or a nickel-cobalt alloy. This affords better adhesion between the polyimide precursor layer and the metal foil, and therefore, in a chemical treatment (such as the etch-back of the polyimide precursor layer), separation can be prevented between the metal foil and the polyimide precursor layer or an insulating layer 9 produced by the imidation of this polyimide precursor layer.

Also, since the cover coat layer 6 of this bump-attached wiring circuit board has a connection opening 11 that allows access to the wiring circuit 1 from the cover coat layer 6 side, the board can be accessed from both sides, and this helps in raising the mounting density of electronic elements.

The present invention provides a bump-attached wiring circuit board with which the bump strength is stable, stable bump connections are possible, and there is no need for bothersome operations such as plating pretreatments. In particular, bump connections on an integrated circuit can be stably produced all at once ultrasonically.

The entire disclosure of the specification, claims, summary and drawings in Japanese Patent Application No. 2000-210482 filed on Jul. 11, 2000 is hereby incorporated by reference.

What is claimed is:

1. A method for manufacturing a bump-attached wiring circuit board in which bumps are formed on a wiring circuit, comprising the steps of:
   (a) laminating a protective film over the bump formation side of a metal foil having a thickness equal to the sum of the thickness of the wiring circuit and the height of the bumps to be formed on the wiring circuit, and forming a wiring circuit formation etching mask on the wiring circuit formation side of the metal foil;

(b) forming a wiring circuit in a predetermined thickness by half-etching the metal foil from the side with the wiring circuit formation etching mask;

(c) removing the wiring circuit formation etching mask, and then providing a cover coat layer to the wiring circuit;

(d) removing the protective film provided to the bump formation side of the metal foil, and then forming a bump formation etching mask on this bump formation side;

(e) forming bumps of a predetermined height by half-etching the metal foil from the bump formation etching mask side;

(f) removing the bump formation etching mask, and then forming a metal thin film layer composed of a different metal from that of the metal foil;

(g) forming a polyimide precursor layer over the metal thin film layer so as to bury the bumps; and (h) etching back the polyimide precursor layer and forming an insulating layer in a predetermined thickness by imidation.

2. The manufacturing method according to claim 1, wherein the metal thin film layer formed in step (f) exhibits higher adhesive force with respect to the polyimide precursor layer than to the metal foil.

3. The manufacturing method according to claim 1, wherein the metal foil is a copper foil, and the metal thin film layer is a thin film of nickel, zinc, tin, or a nickel-cobalt alloy.

4. The manufacturing method according to claim 3, wherein the thickness of the metal thin film layer is 0.01 to 4 μm.

5. The manufacturing method according to claim 3, wherein, when the metal thin film layer is a thin film of zinc or tin, the thickness of the metal thin film layer is 0.1 to 0.5 μm.

6. The manufacturing method according to claim 3, wherein, when the metal thin film layer is a thin film of a nickel-cobalt alloy, the thickness of the metal thin film layer is 0.1 to 4 μm.

7. The manufacturing method according to claim 3, wherein, when the metal thin film layer is a thin film of nickel, the thickness of the metal thin film layer is 0.01 to 1 μm.

8. The manufacturing method according to claim 2, wherein the metal foil is a copper foil, and the metal thin film layer is a thin film of nickel, zinc, tin, or a nickel-cobalt alloy.

* * * * *